United States Patent [19]
Liu

[11] Patent Number: 5,949,245
[45] Date of Patent: Sep. 7, 1999

[54] PROBE CARD WITH GROUND SHIELD STRUCTURE TO MINIMIZE NOISE COUPLING EFFECT DURING MULTIPLE-CHIP TESTING

[75] Inventor: Yu-Hsin Liu, Taichung, Taiwan

[73] Assignee: Powership Semiconductor Corp., Hsinchu, Taiwan

[21] Appl. No.: 08/806,040

[22] Filed: Feb. 1, 1997

[51] Int. Cl.$^6$ .................................................. G01R 31/02
[52] U.S. Cl. .......................................... 324/762; 324/754
[58] Field of Search .................................... 324/754, 755, 324/761, 762, 765; 439/482; 438/14, 15, 18; 257/40, 48

[56] References Cited

U.S. PATENT DOCUMENTS

| | | | |
|---|---|---|---|
| 4,780,670 | 10/1988 | Cherry | 324/754 |
| 5,382,898 | 1/1995 | Subramanian | 324/754 |

*Primary Examiner*—Vinh P. Nguyen
*Attorney, Agent, or Firm*—W. Wayne Liauh

[57] ABSTRACT

A probe card for use in a multi-chip probing test equipment with reduced noise coupling effect is disclosed. It contains (a) a multi-layer circuit board with a window formed at a central portion thereof, the multi-layer circuit board containing a number of contact points arranged on the surface of the multi-layer circuit board for electrically contacting the test head of the test equipment; (b) a plurality of downward pointing testing pins attached to the multi-layer circuit board and electrically connected to the contact points on the surface of the multi-layer circuit board, the testing pins being arranged to face a plurality of semiconductor chips so as to tests to be conducted on the plurality of semiconductor chips; (c) a ground layer formed in the multi-layer circuit board; and (d) a plurality of spaced apart ground paths arranged across the window of the multi-layer circuit board. The plurality of ground paths are connected to the ground layer of the multi-layer circuit board and are arranged so as to separate the testing pins into a plurality of groups each corresponding to a respect semiconductor chip to be tested. The ground layer and the ground paths collectively form a ground shield structure to isolate the semiconductor chips from each other to thereby reduce a ground noise coupling effect between adjacent semiconductor chips during the multi-chip testing.

11 Claims, 10 Drawing Sheets

PROBE CARD WITH GROUND SHIELD STRUCTURE TO MINIMIZE NOISE COUPLING EFFECT DURING MULTIPLE-CHIP TESTING

BACKGROUND OF THE INVENTION

1. Field of the Invention

The present invention relates to an improved structure for a probe card used in a probing test equipment, and more particularly to a multi-test probe card with a ground shield structure to reduce the ground noise coupling effect between adjacent chips on a wafer during testing. The ground shield structure includes a plurality of ground paths arranged across the central window of the probe card and interconnected to the ground layer or a ground shield layer in the probe card to form a ground shield to each adjacent semiconductor chip from each other.

2. Description of the Prior Art

In the manufacture of integrated circuits, it is necessary to test the electrical characteristics of the chips on a wafer by means of a probing test equipment (known as prober). Typically, the probing test equipment includes a probe car(d to perform the test under control of a tester. The probe card is mounted with a plurality of testing pins. Each of the testing pins is in the form as a fine need with an L-shaped structure. The testing pins are disposed so that its front end may project downwardly toward the corresponding contact pad on a semiconductor chip to be tested.

An example of a prior art probe card structure for probing test equipment is disclosed in U.S. Pat. No. 5,134,365 issued Jul. 28, 1992, issued to Okubo et al entitled "probe card in which contact pressure and relative position of each probe end are correctly maintained." This first reference probe card discloses a probe card which includes a resin layer of an elastic, insulative characteristic to fill the central open area or window of the supporter assembled into the probe card. The resin layer makes the probe front ends resiliently held in position so that a deviation from proper respective dispositions by overdrive becomes avoidable. In addition, this prior art U.S. patent discloses an additional devices to enhance the convenience in determining the alignment between the probe front ends and the chip ends, and also in obtaining accurate measurements of a semiconductor chip under test. It is noted that this prior art U.S. patent is adapted to be used in single-test operation. Besides, this prior art patent does not disclose ground noise reducing design.

Another example of the prior art probe card structure is disclosed in U.S. Pat. No. 5,412,329 issued May 2, 1995, issued to Iino et al entitled "probe card" discloses a probe card composed of a supporting plate and a flexible printed circuit board which includes a flexible film base material supported by the supporting plate. When the contact point is brought into contact with the pad formed on the semiconductor chip, the cushioning medium undergoes an elastic deformation, so that the contact between the contact points and the pads is improved. Also, this prior art U.S. patent does not disclose any approach for reducing ground noise during test.

FIG. 1 is a schematic block diagram showing a general structure of a prior art probing test equipment. As shown in the drawing, the prober mainly includes a tester 11, a test head 12, and a probe card 13. A wafer 14 to be tested is located on a chuck 15 which is arranged to face the probe card 13 in space. FIG. 2 is an exploded view showing the arrangement of the conventional probe card 13, the wafer 14, and the chuck 15 of FIG. 1. A number of semiconductor chips are formed on the wafer 13. Typically, the chuck 15 includes a vacuum suction device (not shown in the drawing) for retaining the wafer 14 on the chuck table.

The tester 11 serves as a controller for controlling the test operation of the prober, which is capable of transmitting test signals to the test head 12 and receiving echo signals from the wafer 14 via the test head 12. The test head 12 is equipped with a plurality of downward contact pins 121, and each of the contact pins is electrically connected to the tester 11. The test head serves as an interface for the tester 11 and the probe card 13.

The probe card 13 is located right under the test head 12. A number of contact points 133 are arranged on the surface of the probe card 13, so that each of the contact pins 121 of the test head 12 may electrically contact with corresponding contact point arranged on the probe card 13 during test.

Further, the conventional probe card 13 is formed with a central open area or window 131 at the central portion thereof, so that a selected chip to be tested on the wafer 14 may be observed through the window 131 by means of an optical position sensor, such as a CCD camera (not shown).

The probe card 13 is fitted with a number of downward testing pins 132 which may be arranged in the form of a regular lattice or circular form, dependent on the contact pad arrangement on the semiconductor chip to be tested. Practically, in large-scale integrated circuit, such as memory device or other device, the contact pads are arranged in the central region of the chip as well as the peripheral regions. The testing pins are disposed so that its front end may project downwardly toward a semiconductor chip. Typically, the testing pins 132 are made of tungsten or Au—Cu alloy. The number of the testing pins 132 is equal to the contact pads on the semiconductor chip both in number and in arrangement.

Each testing pin 132 of the probe card is electrically connected to the corresponding contact point 133 by a wiring layout pattern formed on the probe card, so that the test signal from the tester 11 may transmit to the individual testing pin 132 of the probe card 13 via the test head 12 during test.

FIG. 3 is an exploded view showing an improved probe card structure in accordance with another prior art prober. FIG. 4 illustrates the top plan view of the prior art probe card 20 of FIG. 3. This type of probe card is known as multi-test probe card because it is particularly adapted to be used for multi-test operation. For explanation, the same reference numbers used in the previous drawing will be used to refer to the same or like parts.

As shown in FIGS. 3 and 4. it is noted that a number of contact points 203 are also arranged on the probe card 20 for contacting with the contact pins of the test head as described above. However, the probe card 20 is formed with a rectangular window 201 instead of the square window shown in FIG. 2. The dimensions of the rectangular window 201 is designed to cover multiple semiconductor chips on the wafer 14 to perform multi-test function, known as parallel testing. In this case, the testing pins 202 of the probe card 20 are divided into four groups. In other words, four chips on the wafer 14 may be observed through the rectangular window 201 by means of an optical position sensor (not shown). So, the probe card 20 can test four chips at one test time in this case.

FIG.5 is a cross-sectional view of the conventional multi-test probe card 20, taken along line 1—1 of FIG. 4. The probe card 20 is composed of a multi-layer printed circuit board with a central window 201 formed at the central portion of the circuit board and a plurality of testing pins 202. The circuit board includes a power source layer 205, such as Vcc layer, and a ground layer 206 therein. Typically, an insulative film 207 is further formed on the ground layer 206, so that a number of contact points 203 may be arranged on the circuit board. Each contact point 203 arranged on the circuit board is electrically coupled to the corresponding testing pin 202 attached to the bottom surface of the circuit board via a conductive path 204 by well known printed circuit layout technique. Each of the testing pins 202 are further fixed and held by means of an insulative resin or rubber block 208 in position.

With reference to FIG. 4 and FIG. 5, the ground layer 206 which is mounted in the printed circuit board of the probe card 20 forms a ground path structure to surround the central window 201 of the probe card 20. In practice, the ground path is electrically connected to a number of specific testing pins 202, as particularly shown in FIG. 4.

Theoretically speaking, mutual inductance results when an electric current I flows through a closed circuit loop. The mutual inductance will produce a magnetic flux $\Phi$ which is proportional to the amount of the current I. The constant of proportionality is called the inductance L. Therefore, we may write $\Phi=LI$. The amount of the inductance value depends on the geometry of the circuit loop layout and the magnetic properties of the medium containing the field. When an electric current flowing through a first circuit loop produces a mutual flux in a second circuit loop, there will be a mutual inductance M12 occurred between the first circuit loop and the second circuit loop. The mutual inductance M12 is defined as $\Phi12/I1$. The symbol $\Phi12$ represents the flux in the second circuit loop caused by the current I1 in the first circuit loop. Similarly, it can also be derived a mutual inductance between a shield and a center conductor, which may be referred as a shield inductance. By decreasing the shield inductance, the center conductance inductance may be decreased.

FIG. 6 is an equivalent schematic circuit diagram illustrating the ground noise created between two adjacent circuit loops. Ideally, the first currents I11 flowing through the first loop is equal to the second current I22 flowing through the second loop. However, in case the first loop resister R11 is not equal to the second loop resister R22, the first inductance L11 will be not equal to the second inductance L22. It is be better understood from the following calculation:

$$XL11=2\pi fL11$$

$$XL22=2\pi fL22$$

$$X11=R11+2\pi fL11$$

$$X22=R22+2\pi fL22$$

$$V11=I11(R11+2\pi fL11)$$

$$V22=I22(R22+2\pi fL22)$$

The XL11 represents the inductive reactance offered by the inductance L11 of the first loop. The X11 represents the combined impedance of the resistor R11 and the inductive reactance XL11 of the first loop. The V11 is defined as the voltage drop developed across the combined impedance X11 by the first loop current I11 through the resistor R11 and the inductive reactance XL11.

Similarly, the XL22 represents the inductive reactance offered by the inductance L22 of the second loop. The X22 represents the combined impedance of the resistor R22 and the inductive reactance XL22 of the second loop. The V22 is defined as the voltage drop developed across the combined impedance X22 by the second loop current I22 through the resistor R22 and the inductive reactance XL22.

It is noted that a noise will be created by the potential existed between the V22 and the V11.

In performing the probing test for semiconductor chips by using a probing test equipment, ground noise is coming from the ground wire inductance and resistance existing on the probe card. During parallel testing by using the prior art multi-test probe card as shown in FIG. 3, the ground noise from adjacent devices are injected to the next device and thereby creating a complex ground noise coupling effect. Although the ground paths in printed circuit board of the probe card have been sandwiched very carefully, it is hard to isolate each device individually. It is deemed that the conventional probe cards cannot execute a reliable probing test.

During parallel testing, ground noise from adjacent devices are also injected to the next device, and thereby creating a more serious ground noise coupling effect. In practical experience, when the number of testing pins is increased to more than 300 to 600 pins, and the semiconductor chips to be tested are more than 10, it will have an undesired ground noise coupling effect during test. This ground noise is mainly due to the inductance and resistance of the grounding wires. The ground noise occurred will seriously effect the reliability of the probing test.

SUMMARY OF THE INVENTION

For obviating the aforementioned problem and drawback found in the conventional probe card, it is the primary object of the present invention to provide an improved structure for the probe card to eliminate or reduce the ground noise coupling effect during testing. The present invention can increase signal integrity and achieve a more reliable test result with less signal noise fluctuation.

Another object of the present invention is to provide an improved probe card with a ground shield structure. The ground noise bouncing problem can be resolved through using the ground shield to isolate chips form each other. The improved probe card of the present invention is particularly adapted to be used for high-frequency probing test.

Yet another object of the present invention is to provide a multi-test probe card with a ground path structure used in a probing test equipment for reducing ground noise coupling effect between adjacent semiconductor chips on a wafer during test. The ground paths are designed to incorporate with the ground layer of the probe card, so as to commonly forming a ground shield structure for the probe card. To achieve this objects, a plurality of ground paths are arranged across the window of the probe card to separate the testing pins of the probe card into several groups. Further, each of the ground paths is interconnected to the ground layer formed in the circuit board of the probe card. As a result, the ground paths and the ground layer commonly form a ground shield to isolate each semiconductor chip from each other during test.

Further yet another object of the present invention is to provide a modified multi-test probe card with a ground shield structure used in a probing test equipment. A plurality of ground paths are arranged across the window of the probe card to separate the testing pins of the probe card into several groups. Furthermore, the multi-layer circuit board of the probe card includes a ground shield layer which is electrically coupled to the original ground layer of the circuit board. Each of the ground paths is interconnected to the ground shield layer in the circuit board. The ground paths and the ground shield layer commonly form a ground shield structure for the probe card to isolate each semiconductor chip from each other during test.

In order that the present invention may more readily be understood, the following description is given, merely be way of example, reference being made to the accompanying drawings, wherein:

DETAIL DESCRIPTION OF THE PREFERRED EMBODIMENT

The present invention relates to an improved structure of the probe card which is particularly useful in testing large-scale integrated circuit devices, such as a memory device. In the following description, two preferred embodiments will be described in order to provide a thorough understanding of the present invention.

Figure 7:
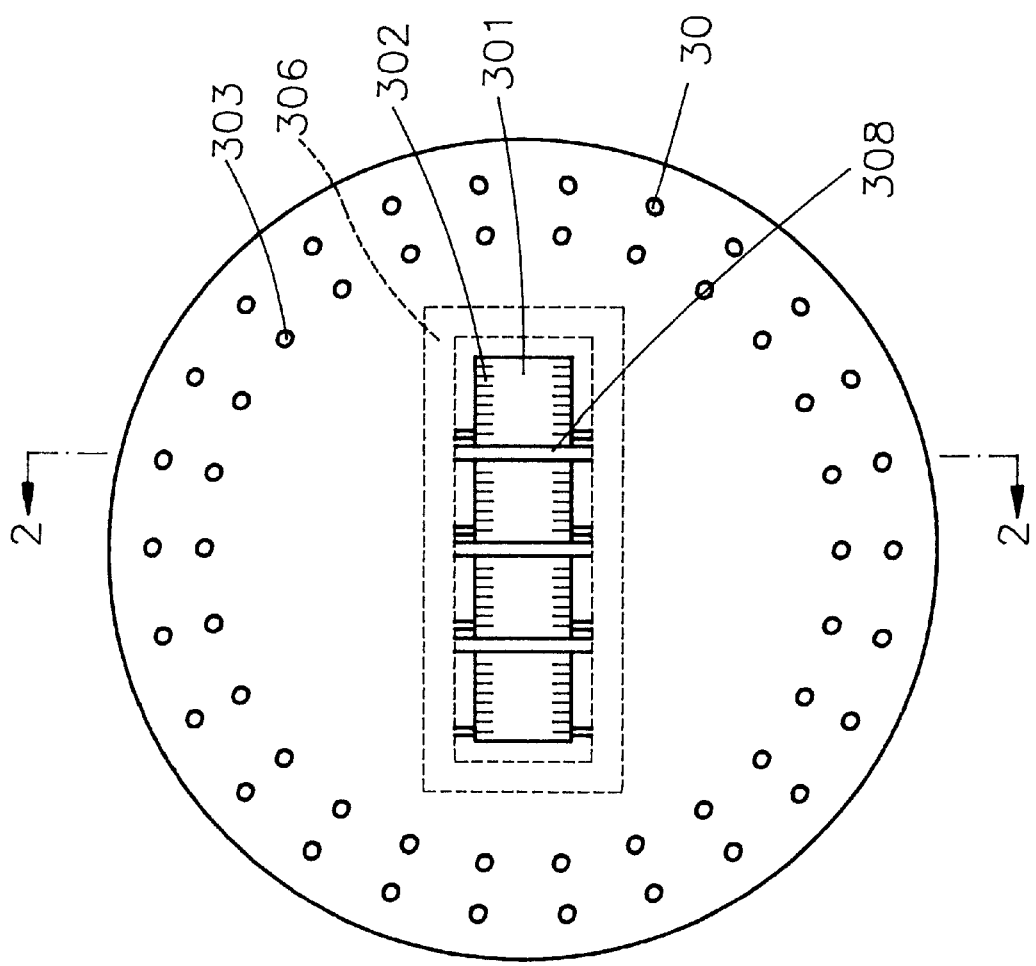
FIG. 7 is a top plane view of the probe card in accordance with the first embodiment of the present invention.

With reference to FIG. 7, it illustrates the top plane view of a probe card adapted to be used in multi-test operation for a probing test equipment (not shown) in accordance with the first embodiment of the present invention. Similar to the structure of the prior art multi-test probe card shown in FIG. 4, the probe card 30 of the present invention is provided with a number of contact points 303 arranged on the surface of the probe card. Each of the contact points 303 may electrically contact with corresponding contact pins of the test head of a probing test equipment (not shown) during test.

At the central portion of the probe card 30, a rectangular window 301 is formed, so that a number of selected semiconductor chips on a wafer to be tested may be observed through the window 301 by an optical position sensor as described above. In this embodiment, the probe card 30 is capable of testing four selected chips as an example at one testing operation.

The probe card 30 is fitted with a number of downward testing pins 302 attached to opposite edges of the window 301. Preferably, the testing pins 302 are made of tungsten or Au—Cu alloy for better conductivity. During test, the front end of each testing pin 302 may pinpoint to a corresponding contact pad on the semiconductor chip. The test procedure is undertaken by creating an electrical contact between testing pins and selected contact pads on the chip, applying test signals to the circuit of the chip, and receiving echo signals from the chip.

Figure 1:
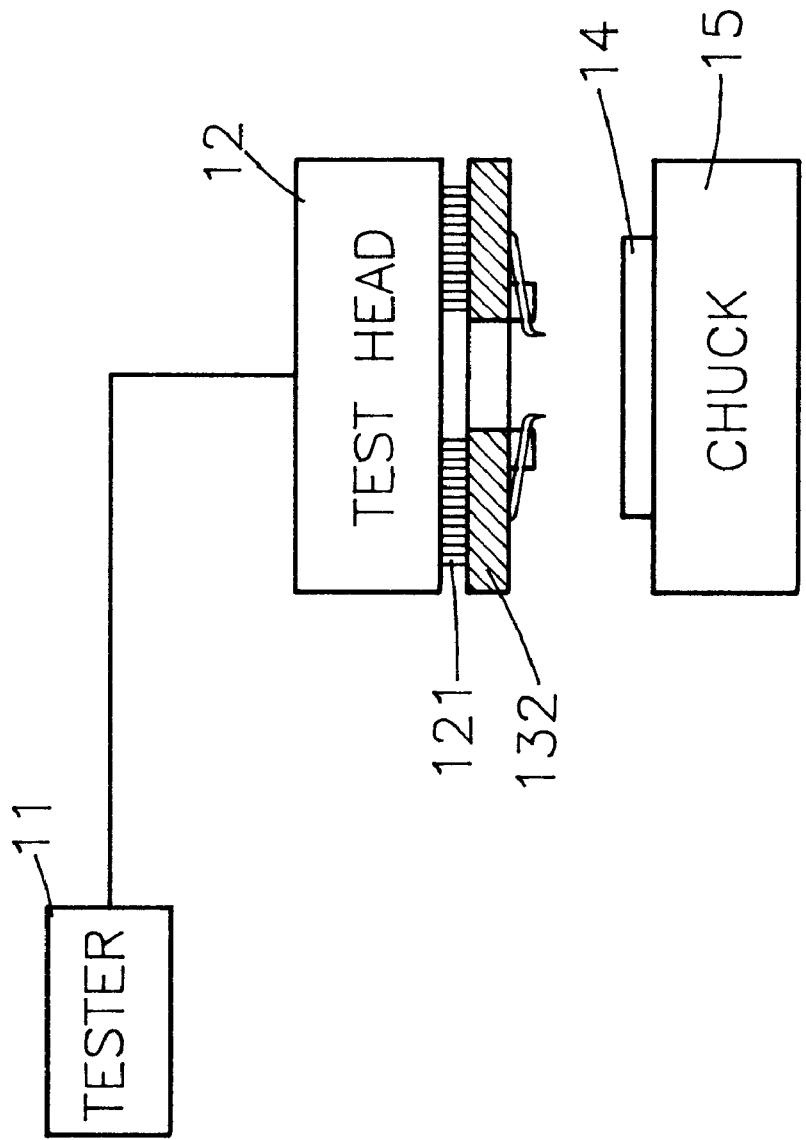
FIG. 1 is a schematic block diagram showing a general structure of a prior art probing test equipment.
Figure 2:
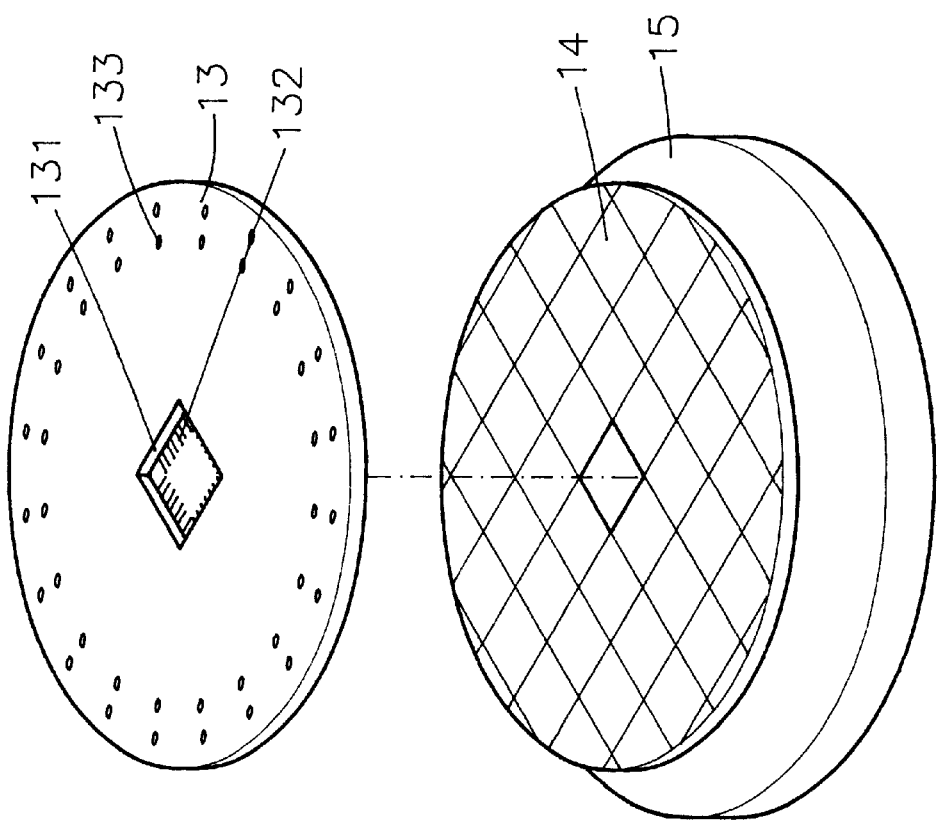
FIG. 2 is an exploded view showing the arrangement of the prior art probe card, the wafer, and the chuck of FIG. 1.
Figure 3:
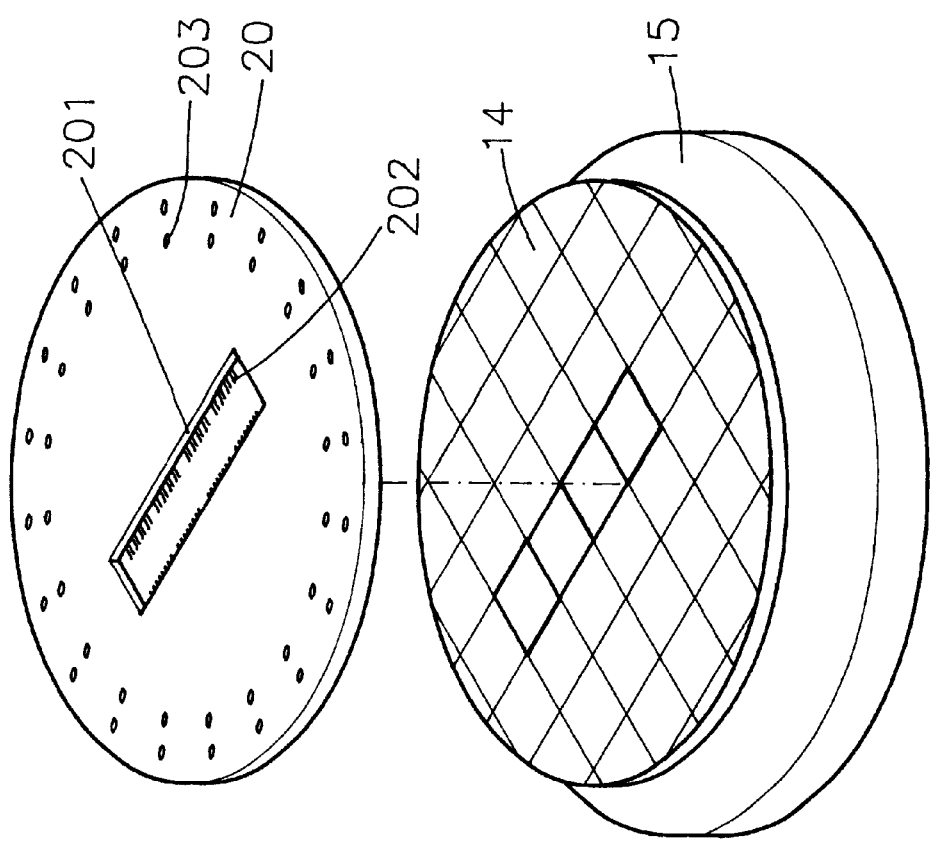
FIG. 3 is an exploded view showing the arrangement of another conventional probe card, a wafer, and a chuck for multi-test operation.
Figure 4:
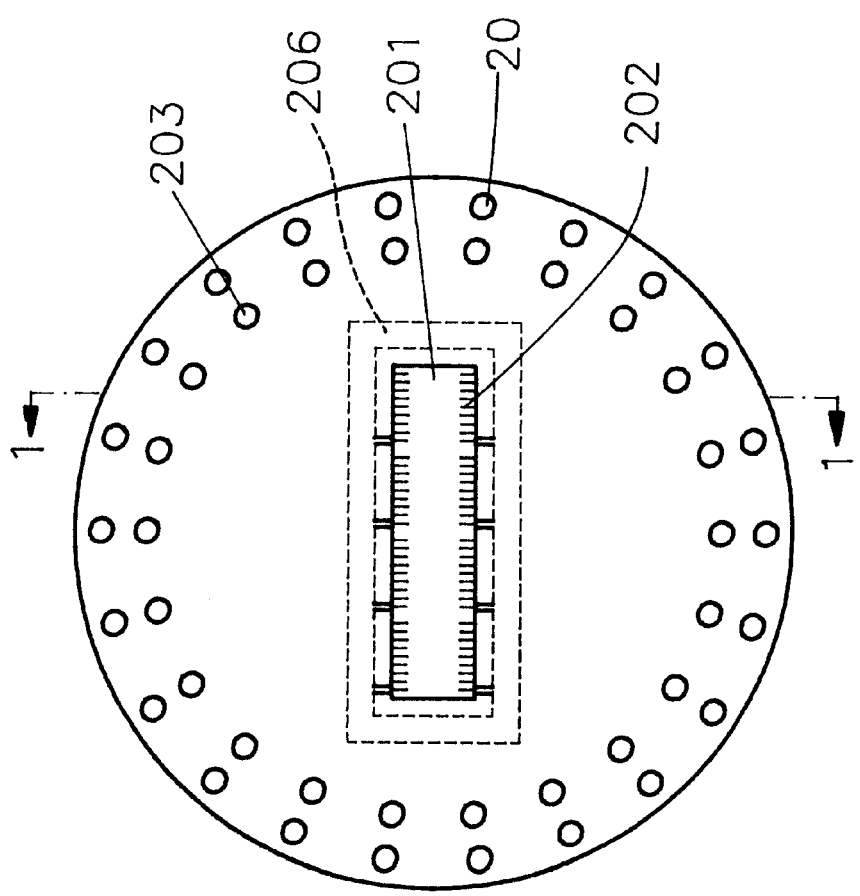
FIG. 4 is a top plane view of the conventional probe card of FIG. 3.
Figure 5:
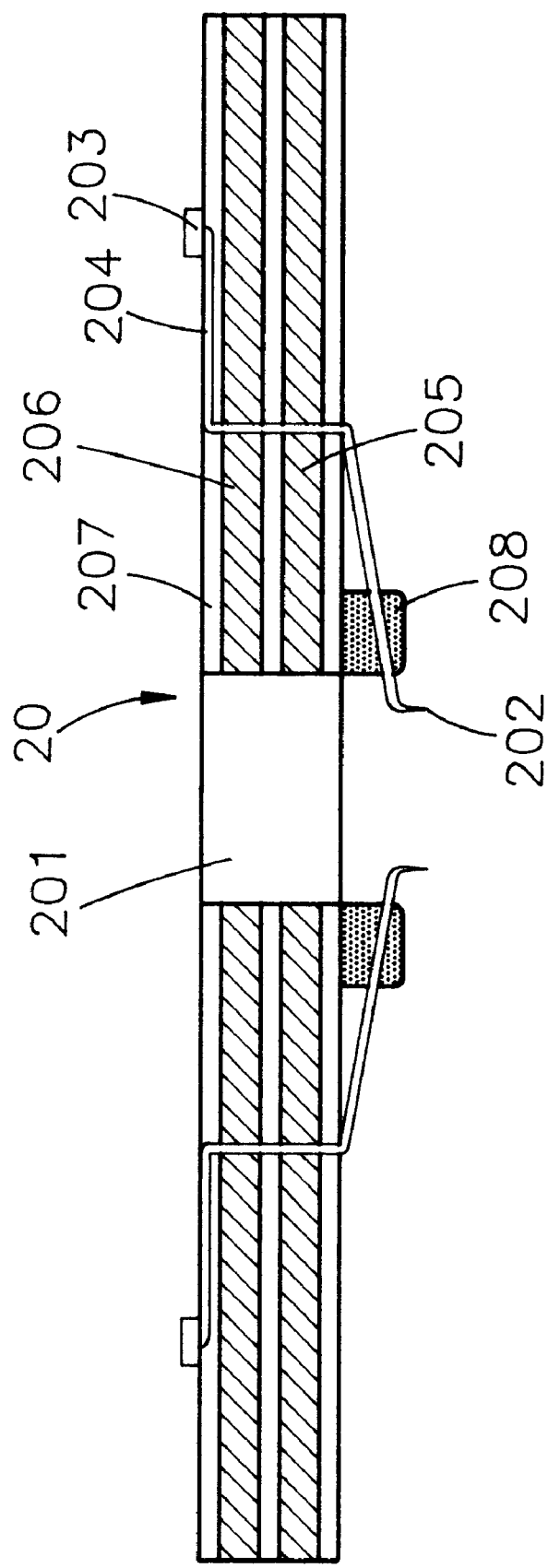
FIG. 5 is an enlarged cross-sectional view of the conventional multi-test probe card taken along line 1—1 of FIG. 4.
Figure 6:
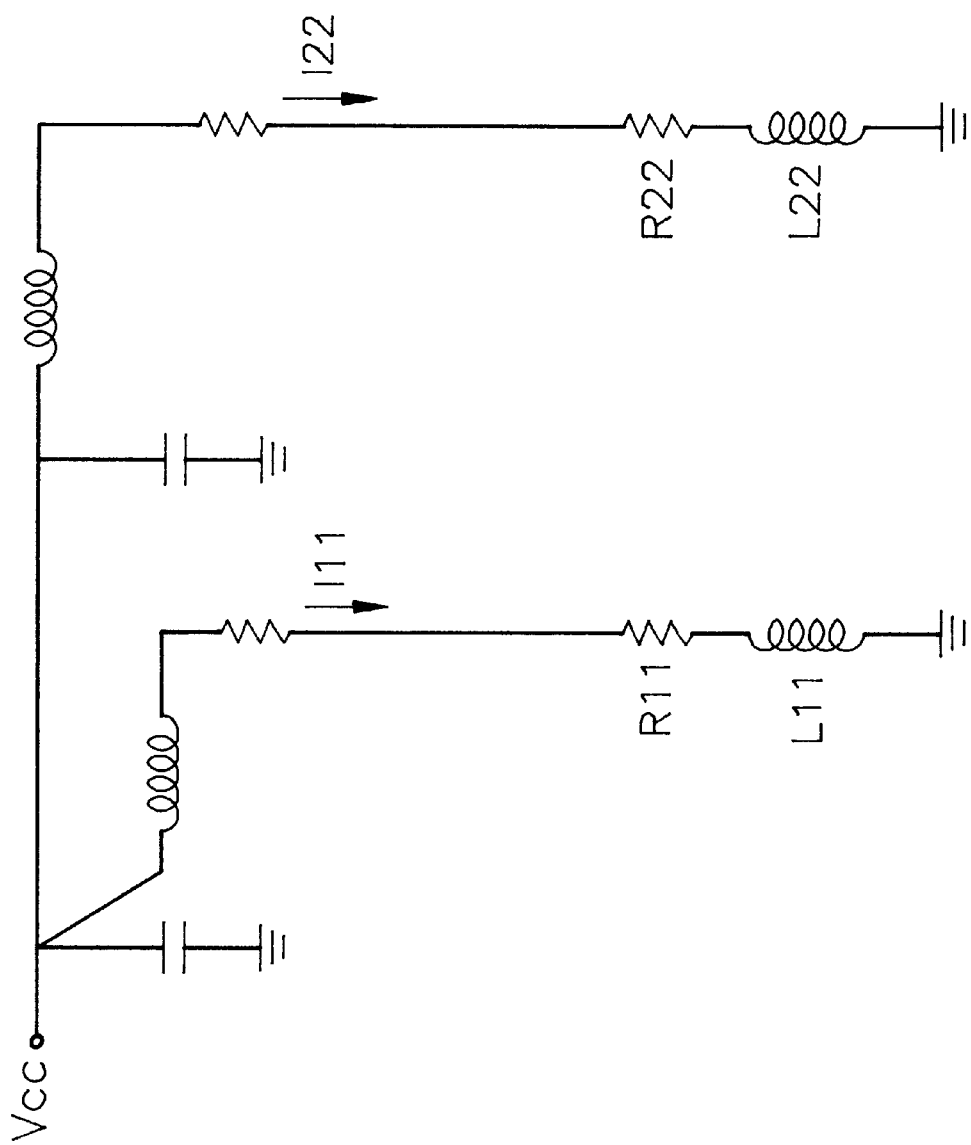
FIG. 6 is an equivalent schematic circuit diagram illustrating the ground noise created between two adjacent circuit loops.

As shown in the drawing, the probe card 30 of this embodiment is additionally provided with three ground paths 308 arranged across the window 301 of the probe card. The ground paths 308 are electrically coupled to the ground layer 306 in the probe card, commonly serving as a ground shield structure for the probe card 30. As same as the ground layer structure as shown in FIG. 4, the ground layer 306 of this embodiment is also electrically coupled to a number of specific testing pins 302 of the probe card, as shown in FIG. 7. The purpose of the ground shield structure is to reduce or eliminate the ground noise coupling effect between the adjacent chips during test. The structure of the ground shield will be described below in more detail.

Figure 8:
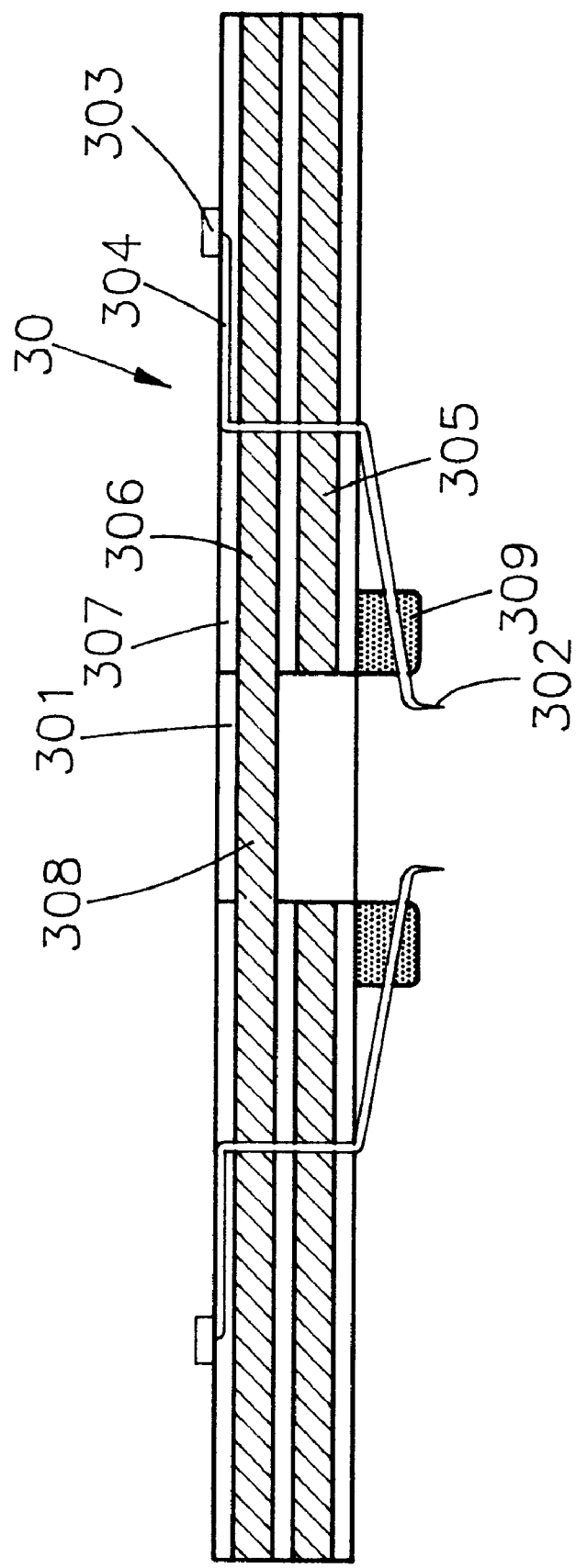
FIG. 8 is an enlarged cross-sectional view of the probe card taken along line 2—2 of FIG. 7.

FIG. 8 is a cross-sectional view of the probe card 30, taken along line 2—2 of FIG. 7, in accordance with the first embodiment of the present invention, As shown in the drawing, the probe card 30 is composed of a multi-layer printed circuit board with a central rectangular window 301 formed at the central portion of the circuit board. A plurality of downward testing pins 302 are attached to the opposite edges of the window 301. The circuit board of the probe card is made of polymer material and normally includes a power source layer 305 and a ground layer 306 therein. An insulative film 307 serving as a passivation layer is further formed on the ground layer 206, so that a number of contact points 303 may be arranged on the circuit board. Each testing point 303 arranged on the circuit board is electrically connected to the corresponding testing pin 302 via a conductive path 304 by well known printed circuit layout technique. Each of the testing pins 302 is further fixed and held by means of a rubber block 308 mounted on the bottom surface near the window area of the probe card in position.

Figure 9:
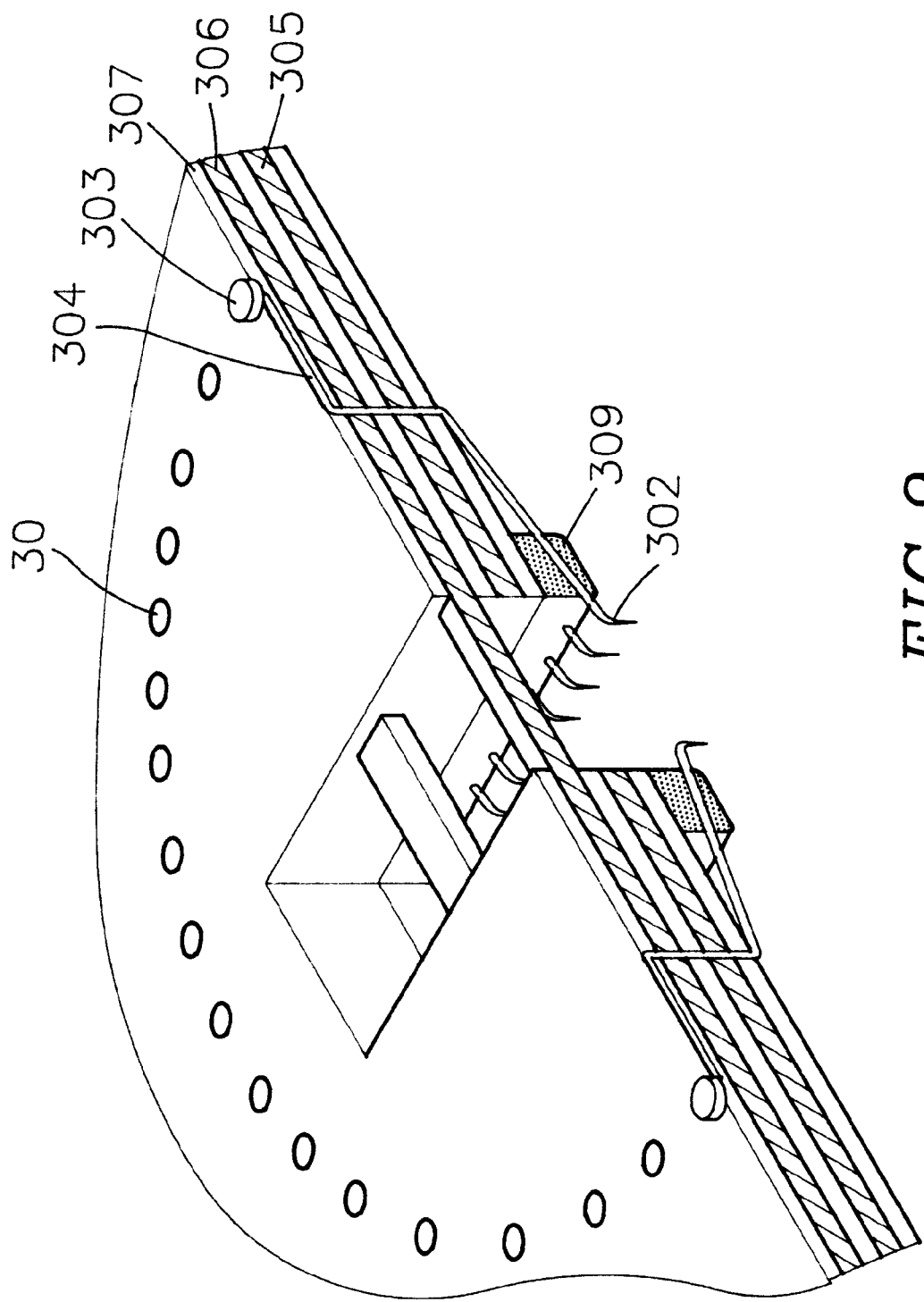
FIG. 9 is an enlarged perspective view showing the inner structure of the probe card of the first embodiment of the present invention.

FIG. 9 is a partial perspective view of the probe card of the present invention, showing the ground paths 308 are arranged across the window 301 and electrically coupled to the ground layer 306 in the circuit board of the probe card 30. In such an arrangement, the ground paths 308 and the ground layer 306 of the circuit board commonly form a ground shield structure for the probe card. During test, the ground shield of the present invention can effectively separate the chips from each other to isolate ground noise coupling effect therebetween. That is, the ground noise coupling effect between the adjacent chips on a wafer can be effectively reduced or eliminated. In practice, a passivation layer or an insulative layer is preferably formed on the ground paths 308 for protection.

The following is a description of a probe card according to the second embodiment of the present invention.

Figure 10:
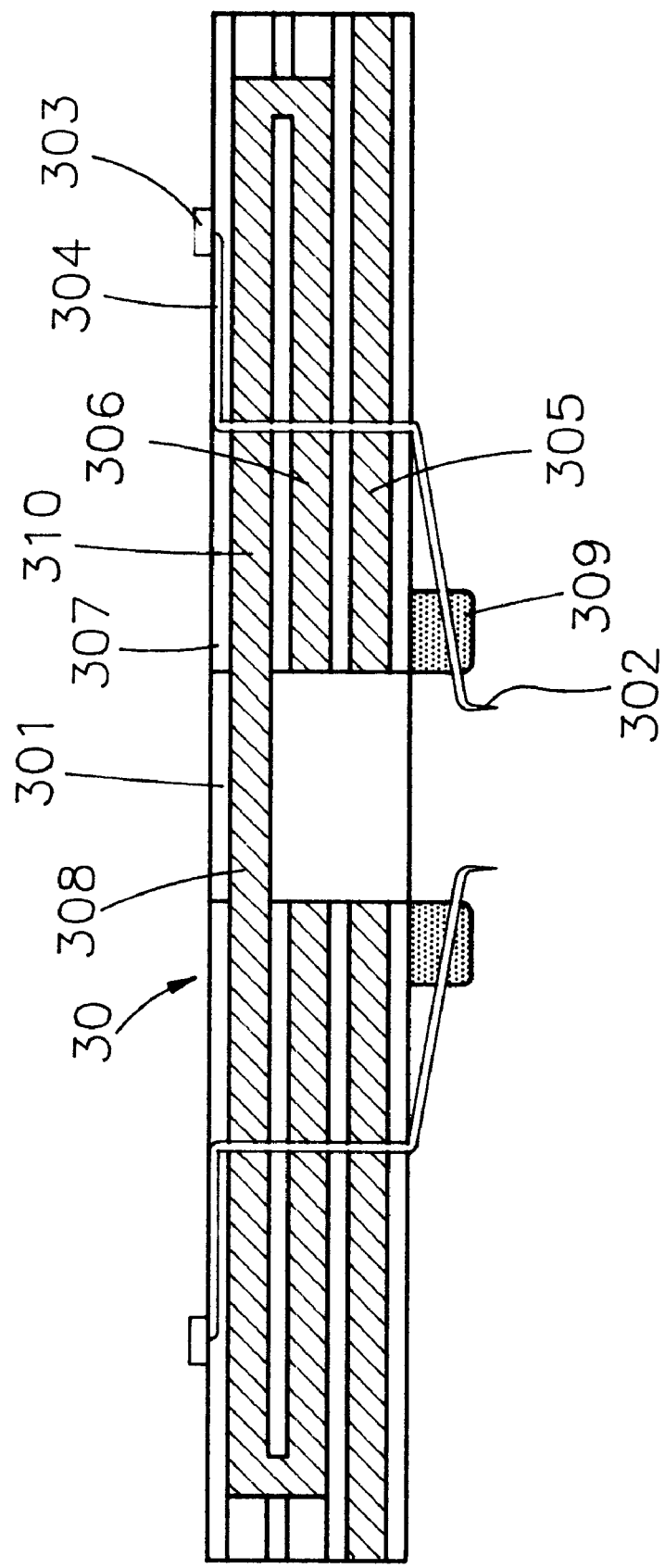
FIG. 10 is an enlarged cross-sectional view of the probe card in accordance with the second embodiment of the present invention.

With reference to FIG. 10, it is a cross-sectional view showing a further modified probe card in accordance with the second embodiment of the present invention. The major parts of this modified embodiment are similar to that of the first embodiment described above, except for the interconnection between the ground paths and the ground layer in the circuit board of the probe card. So, the same reference numbers used in the previous embodiment as shown in FIG. 8 will be used to refer to the same parts.

In the second embodiment of the present invention as shown in FIG. 10, the probe card 30 similarly includes a multi-layer printed circuit board with a rectangular window 301 formed at the central portion thereof and a plurality of downward testing pins 302. The circuit board of the probe card also includes a power source layer 305, a ground layer 306, an insulative film 307, and conductive path 304 for electrically connecting the contact point 303 on the circuit board and the testing pin 302.

In addition to the power source layer 305 and the ground layer 306 in the circuit board of the probe card 30, a ground shield layer 310 is further arranged above the original ground layer 306. An insulative layer is interposed between the ground shield layer 310 and the original ground layer 306 for purpose of providing an isolation layer. In practice, the ground paths 308 are electrically coupled to the ground shield layer 310 and the original ground layer 306. In such an arrangement, the ground paths 308 and the ground shield layer 310 commonly serve as a ground shield structure for the probe card 30 for the purpose of reducing or eliminating the ground noise coupling effect during test.

It is noted from the embodiments described above, the improved probe card with ground shield structure can be easily formed by using well known printed circuit layout technique.

In conclusion, from the detail description above, it is obvious that the improved probe card of the present invention is capable of effectively reducing the ground noise during test, and therefore meets the requirements of patentability. While the arrangement and structure described above constitutes a preferred embodiment of this invention, it is to be understood that the present invention is not limited to this precise form and that changes may be made therein without departing from the scope and spirit of the invention as defined in the appended claim.

I claim:

1. A probe card for use in a probing test equipment which is equipped with a tester and a test head for testing electrical characteristics of multiple semiconductor chips on a wafer, said probe card comprising:

a multi-layer circuit board with a window formed at a central portion thereof, said multi-layer circuit board containing a number of contact points arranged on a surface of said multi-layer circuit board for electrically contacting the test head;

a plurality of downward pointing testing pins attached to said multi-layer circuit board and electrically connected to said contact points on said surface of said multi-layer circuit board, said testing pins being arranged to face a plurality of semiconductor chips so as tests to be conducted on the plurality of semiconductor chips;

a ground layer formed in the multi-layer circuit board; and a plurality of spaced apart ground paths arranged across said window of said multi-layer circuit board, wherein said plurality of ground paths are connected to said ground layer of the multi-layer circuit board and are arranged so as to separate said testing pins into a plurality of groups each corresponding to a respect semiconductor chip to be tested;

further wherein said ground layer and said ground paths collectively form a ground shield structure to isolate the semiconductor chips from each other to thereby reduce a ground noise coupling effect between adjacent semiconductor chips during testing.

2. The probe card as claimed in claim 1, wherein said testing pins attached to the circuit board are separated into four groups by three ground paths arranged in parallel.

3. The probe card as claimed in claim 1, which further comprises an insulative film provided on top of said ground layer.

4. The probe card as claimed in claim 1, wherein the ground paths are further provided with a protective layer thereon.

5. The probe card as claimed in claim 1, wherein the circuit board is made of polymer material.

6. A probe card for use in a probing test equipment which is equipped with a tester and a test head for testing electrical characteristics of multiple semiconductor chips on a wafer, said probe card comprising:

a multi-layer circuit board with a window formed in a central portion thereof, said multi-layer circuit board containing a plurality of contact points arranged on a surface of said multi-layer circuit board for electrically contacting with the test head;

a plurality of downward pointing testing pins attached to said multi-layer circuit board and electrically connected to said contact points on the circuit board, said testing pins being arranged to face the semiconductor chips so as tests to be conducted on the plurality of semiconductor chips;

a ground layer formed in said multi-layer circuit board;

a ground shield layer electrically coupled to the ground layer; and a plurality of spaced apart ground paths arranged across said window of said multi-layer circuit board, wherein said ground paths are connected to the ground shield layer of the multi-layer circuit board so as to separate said testing pins into a plurality of groups each group corresponding to a respective semiconductor chip to be tested;

further wherein said ground shield layer and said ground paths collectively form a ground shield structure to isolate the semiconductor chips from each other to reduce a ground noise coupling effect between adjacent semiconductor chips during testing.

7. The probe card as claimed in claim 6, wherein said ground shield layer is arranged above said ground layer with an insulative layer interposed therebetween.

8. The probe card as claimed in claim 7, wherein the ground layer is arranged in an upper portion of said multi-layer circuit board.

9. The probe card as claimed in claim 6, wherein the testing pins attached to the circuit board are separated into four groups by three ground paths arranged in parallel.

10. The probe card as claimed in claim 6, wherein said ground paths are further provided with a protective layer thereon.

11. The probe card as claimed in claim 6, wherein said multi-layer circuit board is made of polymer material.

* * * * *

UNITED STATES PATENT AND TRADEMARK OFFICE
CERTIFICATE OF CORRECTION

PATENT NO. : 5,949,245
DATED : September 7, 1999
INVENTOR(S) : Liu et al.

It is certified that error appears in the above-identified patent and that said Letters Patent is hereby corrected as shown below:

Title page,
Item [73], Assignee, should read -- Powerchip Semiconductor Corp. --.

Signed and Sealed this

Twenty-eighth Day of February, 2006

JON W. DUDAS
*Director of the United States Patent and Trademark Office*